United States Patent [19]
Pein

[11] Patent Number: 5,378,912
[45] Date of Patent: Jan. 3, 1995

[54] LATERAL SEMICONDUCTOR-ON-INSULATOR (SOI) SEMICONDUCTOR DEVICE HAVING A LATERAL DRIFT REGION

[75] Inventor: Howard B. Pein, Briarcliff Manor, N.Y.

[73] Assignee: Philips Electronics North America Corporation, New York, N.Y.

[21] Appl. No.: 151,075

[22] Filed: Nov. 10, 1993

[51] Int. Cl.$^6$ .................. H01L 29/10; H01L 27/01
[52] U.S. Cl. .................. 257/335; 257/339; 257/343; 257/77; 257/618; 257/347
[58] Field of Search .............. 257/335, 336, 343, 339, 257/76, 77, 78, 613, 618, 347

[56] References Cited

U.S. PATENT DOCUMENTS

| | | | |
|---|---|---|---|
| 4,922,327 | 5/1990 | Mena et al. | 357/23.4 |
| 4,963,951 | 10/1990 | Adler et al. | 357/23.7 |
| 4,983,538 | 1/1991 | Gotou | 437/100 |
| 5,059,547 | 10/1991 | Shirai | 437/40 |
| 5,113,236 | 5/1992 | Arnold et al. | 357/41 |
| 5,246,870 | 9/1993 | Merchant | 437/21 |

FOREIGN PATENT DOCUMENTS 0522670 11/1985 European Pat. Off. ...... H01L 29/72
0514060 11/1992 European Pat. Off. ... H01L 29/784

*Primary Examiner*—Mark V. Prenty
*Attorney, Agent, or Firm*—Steven R. Biren

[57] ABSTRACT

A lateral Semiconductor-On-Insulator (SOI) device includes a substrate, a buried insulating layer on the substrate, and a lateral semiconductor device such as an LDMOS transistor, an LIGBT, a lateral thyristor, or a lateral high-voltage diode on the insulating layer. The semiconductor device (in the case of an LDMOS transistor) includes a source region, a channel region, an insulated gate electrode over the channel region, a lateral drift region on the buried insulating layer and having a substantially linearly graded lateral doping profile, and a drain region which is laterally spaced apart from the channel region and connected to the channel region by the drift region. In order to substantially improve the breakdown voltage of the device, typically a high-voltage power device, while reducing the "on" resistance, the lateral drift region is formed of a wide bandgap semiconductor material such as silicon carbide.

10 Claims, 1 Drawing Sheet

LATERAL SEMICONDUCTOR-ON-INSULATOR (SOI) SEMICONDUCTOR DEVICE HAVING A LATERAL DRIFT REGION

BACKGROUND OF THE INVENTION

The invention is in the field of Semiconductor-On-Insulator (SOI) devices, and relates specifically to lateral SOI devices for high-voltage and power applications.

In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks.

One category of power devices that has shown considerable promise uses a semiconductor (usually silicon) layer provided on an insulating layer in a lateral configuration. A typical lateral double-diffused MOS (LDMOS) transistor in an SOI configuration is shown in U.S. Pat. No. 5,059,547. Such devices, although an improvement over earlier devices, are still a compromise in terms of the tradeoff between breakdown voltage and "on" resistance.

An improvement over the basic SOI structure, in which increased breakdown voltages are achieved by providing a linear doping profile in the drift region, is shown in U.S. Pat. No. 5,246,870 and related U.S. patent application Ser. No. 08/015,061, filed Feb. 8, 1993, now U.S. Pat. No. 5,300,448, both commonly owned with the instant application. In these SOI devices, the drift region between the channel and drain in a lateral MOS structure is provided with a linear lateral doping density profile, an expedient which results in substantially increased breakdown voltage characteristics.

A further improvement in the operating characteristics of SOI devices has been attempted by fabricating devices in wide bandgap materials such as silicon carbide (SIC). In U.S. Pat. No. 4,983,538, for example, a conventional MOSFET is shown in a silicon carbide layer on an insulator. However, as noted in that Patent, the use of SiC entails various manufacturing problems and complexities, and such materials are still not commercially feasible for fabricating lateral SOI power devices.

Accordingly, it would be desirable to have a lateral SOI device having a drift region of a wide bandgap semiconductor material in order to obtain superior operational characteristics, in a device configuration which is commercially feasible for manufacture using known processing technology.

SUMMARY OF THE INVENTION

It is therefore an object of the invention to provide a lateral SOI device having a high breakdown voltage, low "on" resistance and other desirable operational properties in a device configuration which can be economically manufactured using known processing technology.

In accordance with the invention, this object is achieved by providing a lateral SOI device with a lateral drift region on a buried insulating layer, and forming the drift region of a wide bandgap semiconductor material such as SiC with a substantially linearly graded lateral doping profile.

In a first embodiment of the device, the source region, at least a part of the channel region and the drain region are provided in a semiconductor layer provided on top of the drift region of wide bandgap semiconductor material. This embodiment has the advantage that all of the major processing steps are performed on a semiconductor layer which can be a conventional silicon layer, thus permitting the use of standard fabrication techniques. However, a potential drawback of this embodiment is that, depending on the band offset between silicon and the wide bandgap material (such as SIC), there exists a potential for a heterojunction to be formed at the interface between these two materials that would impede current flow.

Accordingly, in a second embodiment of the invention, the source side of the device, containing the source region and channel region, is provided in the wide bandgap drift region. While this approach avoids the risk of forming a heterojunction, some processing of the wide bandgap material is required, thus making the fabrication process somewhat more difficult. However, it should be noted that, even in this embodiment, much of the processing will be performed in silicon, thus making the device easier to fabricate than one formed entirely in a wide bandgap material. Furthermore, when a lateral SOI device in accordance with the invention is used in a power integrated circuit (PIC), all of the low-voltage components in either embodiment can be fabricated in silicon.

Both embodiments of the invention possess excellent breakdown voltage characteristics with low "on" resistance, in a configuration which is commercially feasible for manufacture using known processing technology. Although various wide bandgap semiconductor materials, such as gallium arsenide, can be used, silicon carbide is a preferred material because it can be grown epitaxially on silicon, it has a wide bandgap (with a correspondingly high breakdown electric field strength), a high thermal conductivity, a small dielectric constant, and it is compatible with conventional silicon processing technology.

BRIEF DESCRIPTION OF THE DRAWING

The invention may be more completely understood with reference to the following detailed description, to be read in conjunction with the accompanying drawing, in which.

Figure 1:
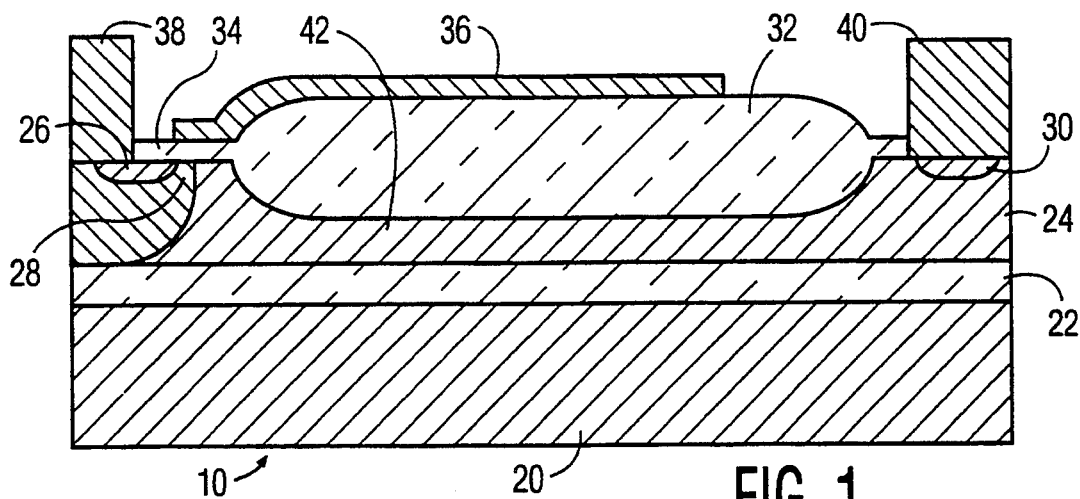
FIG. 1 shows a cross-sectional view of a prior-art LDMOS transistor.

In the drawing, semiconductor regions having the same conductivity type are generally hatched in the same direction, and it should be noted that the figures are not drawn to scale.

DESCRIPTION OF THE PREFERRED EMBODIMENTS

A typical prior-art LDMOS transistor 10 is shown in FIG. 1. This transistor includes a substrate 20, typically of n-type silicon material having a doping concentration of $10^{12}$–$10^{20}$ at/cm$^3$, on which is provided a buried insulating layer 22, typically a silicon oxide layer of between about 0.1 micron and 5.0 microns thickness. A semiconductor layer 24, here an n-type silicon layer having a thickness of about 0.3 micron up to 3.0 microns is provided on the buried insulating layer 22. Advantageously, semiconductor layer 24 may have a substantially linearly graded lateral doping profile, with a doping dose of about $10^{11}$–$5 \times 10^{12}$ at/cm$^2$ at its left (source) side and a doping dose of $10^{13}$–$10^{15}$ at/cm$^2$ at its right (drain) side. A lateral semiconductor device, in this case an LDMOS transistor, is provided in the semiconductor layer 24 (sometimes called a "top layer") on the buried insulating layer 22. Other types of lateral semiconductor devices that may be provided in the semiconductor layer 24 include a lateral insulated-gate bipolar transistor (LIGBT), a lateral thyristor, or even a lateral high-voltage diode.

The LDMOS transistor shown in FIG. 1 includes an n-type source region 26 having a high doping dose of greater than $10^{15}$ at/cm$^2$, a p-type channel region 28 having a doping concentration at the surface of between $10^{16}$ and $5 \times 10^{17}$ at/cm$^3$, and a drain region which includes highly-doped n-type region 30, which has a doping dose of greater than $10^{15}$ at/cm$^2$.

In a manner well known to those skilled in the art, an insulating layer, such as LOCOS oxide layer 32 is provided in and on semiconductor layer 24 between the source and drain regions of the device, with a thinner gate oxide insulating layer 34 being provided over the channel region and a portion of the source region. The LOCOS insulating layer (field oxide layer) 32 may typically be about 0.5–2.0 microns thick, while the thinner gate oxide is about 0.03–0.1 microns thick. A gate electrode 36, typically of polysilicon, is provided on the LOCOS field oxide 32 and gate oxide 34, and source electrode 38 and drain electrode 40, typically of aluminum or other suitable metal, are provided over the source and drain regions, respectively.

In the device shown in FIG. 1, the channel region 28 and drain region 30 are coupled by a thin lateral drift region 42 having a substantially linearly graded lateral doping profile as described above. In prior-art devices such as the one shown, the drift region is formed of a portion of the semiconductor layer 24, and is accordingly of n-type silicon material. The drift region 42 is covered by the field oxide 32 over the major portion of its length, with a part of the gate electrode 36 covering a major portion of the field oxide 32.

While devices such as the one shown in FIG. 1 offer good high voltage performance, they still suffer from a number of drawbacks. Typically, a comprise must be made in terms of the trade off between breakdown voltage and "on" resistance, and other characteristics, such as thermal conductivity and dielectric constant, are not necessarily optimized. While it has been recognized, at least theoretically, that a further improvement in operating characteristics might be obtained by fabricating devices in wide bandgap materials such as SiC, the use of SiC entails various manufacturing problems and complexities, such that it is still not commercially feasible to fabricate lateral SOI power devices entirely in SiC technology.

Figure 2:
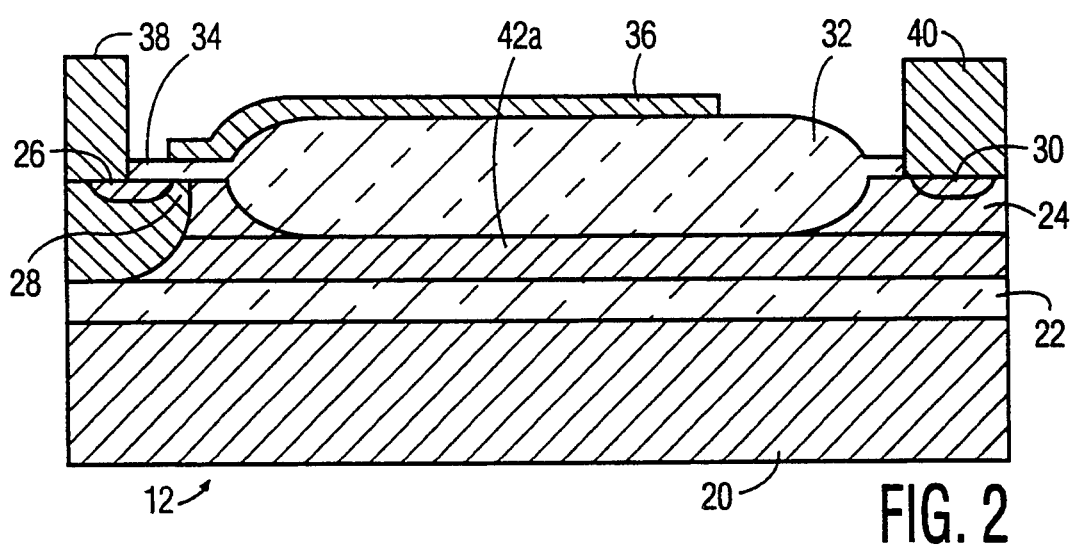
FIG. 2 shows a cross-sectional view of a first embodiment of an LDMOS transistor in accordance with the invention.

A device structure which offers the operational advantages of SiC technology, but yet which can be economically manufactured using known process technology, is shown in FIG. 2. In FIG. 2, LDMOS transistor 12 is in most respects similar to the prior-art device 10 shown in FIG. 1, with like parts being provided with like reference numerals for clarity. Additionally, physical parameters such as doping levels and layer thicknesses for comparable regions are as described in connection with FIG. 1.

The improvement in the device of FIG. 2 is achieved by providing a lateral drift region 42a of a wide bandgap semiconductor material such as SiC, rather than using a portion of the silicon semiconductor layer 24 for the drift region 42 as shown in FIG. 1. It should be emphasized that while SiC is a preferred material, and is used in the embodiments shown, other wide bandgap semiconductor materials with staggered band offset, such as gallium arsenide, may be used instead.

By providing the drift region 42a of a wide bandgap semiconductor material such as SiC, having a substantially linearly graded lateral doping profile as described above, several important advantages are obtained over the prior-art configuration of FIG. 1. Since breakdown voltage depends on the magnitude of the bandgap of the semiconductor material used, a wider bandgap material, such as SiC, will have a higher breakdown voltage than a material such as silicon for the same device configuration. However, as noted above, SiC and other wide bandgap materials have not been extensively used heretofore because of processing and fabrication problems. In the device shown in FIG. 2, these problems are avoided by fabricating the device in a combination of silicon and SiC layers, with the wide bandgap material being adjacent the buried insulating layer 22, and the silicon portions of the semiconductor layer 24 being adjacent the device surface. In this manner, dramatically improved breakdown voltage and "on" resistance characteristics can be achieved, while avoiding the need to perform extensive processing of the SiC. Although various wide bandgap materials may be used for the drift region 42a, SiC is particularly advantageous because it can be grown epitaxially on silicon, it has a wide bandgap with a correspondingly high breakdown electric field strength, a high thermal conductivity, a small dielectric constant, and is compatible with conventional silicon processing technology.

Since the high electric fields in SOI devices of the type shown occur at the buried oxide-semiconductor layer interface, along the drift region, substantially improved breakdown voltage characteristics, very low leakage current at high temperatures, and reduced "on" resistance are obtained by using a wide bandgap material such as SiC at this location. Additionally, use of a drift region layer of SiC allows thinner buried oxides to be used, which simplifies processing and reduces the thermal impedance between the device and the substrate. On the other hand, since the source, channel and drain are all fabricated in the overlying semiconductor layer 24, conventional silicon processing techniques can be used to form oxides, diffused regions, and contacts. This feature is of particular importance in PIC applications, because it permits all of the associated low-voltage circuitry to be integrated in silicon, thereby substantially simplifying the manufacturing process.

An additional advantage of the device shown in FIG. 2 arises from the fact that SiC has a much lower oxidation rate than silicon, thus providing a large process window for ensuring that all of the silicon in layer 24 lying above the SiC drift region 42a is oxidized to form the thick field oxide layer 32, without affecting the thickness uniformity of the underlying drift region during the oxidation process. It has also been found that, for equivalent breakdown voltages, the use of SiC as described above provides a reduction in specific "on" resistance of about two orders of magnitude, compared to silicon.

Figure 3:
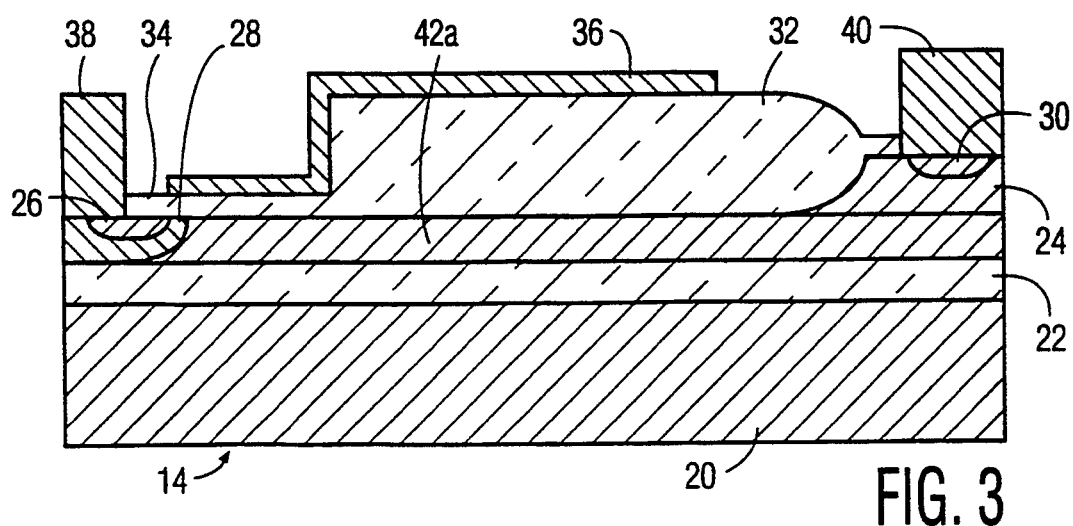
FIG. 3 shows a cross-sectional view of an LDMOS transistor in accordance with a second embodiment of the invention.

One potential drawback of the device shown in FIG. 2 is that, depending on the band offset between silicon and SiC, there exists the potential for a heterojunction to be formed at the silicon/SiC interface that would impede current flow. In order to avoid this potential problem, an alternate configuration, shown in FIG. 3, may be used. In FIG. 3, LDMOS transistor 14 differs from device 12 shown in FIG. 2 in that source region 26 and channel region 28 are formed in the SiC (or similar wide handicap material) of the drift region 42a, rather than in the overlying semiconductor layer 24. This embodiment eliminates the silicon/SiC interface at the source side of the device, and thus the potential for forming a heterojunction, but has the drawback that some processing will have to be done in the SiC layer. Nevertheless, it should be noted that, in a typical PIC device, the vast majority of the processing will still be carried out in silicon, thus making the fabrication of this device commercially feasible.

In FIGS. 2 and 3, the silicon carbide layer having drift region 42a may typically have a thickness of between about 0.05 micron and 2.0 microns, and may be formed of epitaxially grown silicon carbide doped with a substantially linearly graded lateral doping profile having a doping dose of about $10^{11}$–$5 \times 10^{12}$ at/cm$^2$ at the source and about $10^{13}$–$10^{15}$ at/cm$^2$ at the drain end. In all of the embodiments shown, the source, drift region and drain regions are of n-type conductivity, with the channel region being of p-type conductivity. However, it should be understood that the conductivity types of these regions may all be reversed simultaneously.

In summary, the present invention provides a lateral SOI device having a high breakdown voltage, low "on" resistance and other desirable operational properties in a device configuration which can be economically manufactured using known processing technology. As described, these advantages are achieved by providing lateral devices in which the drift region is of SiC or other wide bandgap material, and in which at least a portion of the device is fabricated in silicon.

While the invention has been particularly shown and described with reference to several preferred embodiments thereof, it will be understood by those skilled in the art that various changes in form and detail may be made without departing from the spirit or scope of the invention.

What is claimed is:

1. A lateral Semiconductor-on-Insulator (SOI) device comprising a substrate, a buried insulating layer on said substrate, and a lateral semiconductor device on said insulating layer, said semiconductor device comprising a source region of a first conductivity type, a channel region of a second conductivity type opposite to that of the first, an insulated gate electrode over said channel region, a lateral drift region of said first conductivity type on said buried insulating layer and having a substantially linearly graded lateral doping profile, and a drain region of said first conductivity type, laterally spaced apart from said channel region and connected thereto by said drift region, characterized in that said lateral drift region comprises a Semiconductor layer of a wide bandgap semiconductor material, said material having a wider bandgap than that of silicon.

2. A lateral SOI device as in claim 1, wherein said drain region is provided in a semiconductor layer provided on top of said drift region.

3. A lateral SOI device as in claim 2, wherein said source region and at least a part of said channel region are also provided in said semiconductor layer provided on top of said drift region.

4. A lateral SOI device as in claim 2, wherein said source region and said channel region are provided in the same semiconductor layer as said drift region.

5. A lateral SOI device as in claim 1, wherein said wide bandgap semiconductor material comprises silicon carbide.

6. A lateral SOI device as in claim 5, wherein said drift region has a thickness of between about 0.05 micron and 2.0 microns.

7. A lateral SOI device as in claim 6, wherein said drift region has a doping dose of between about $10^{11}$ at/cm$^2$ and $5 \times 10^{12}$ at/cm$^2$ adjacent said channel region and between about $10^{13}$ at/cm$^2$ and $10^{15}$ at/cm$^2$ adjacent said drain region.

8. A lateral SOI device as in claim 1, wherein said buried insulating layer comprises an oxide layer having a thickness of between about 0.1 micron and about 5.0 microns.

9. A lateral SOI device as in claim 1, wherein said wide bandgap semiconductor material comprises gallium arsenide.

10. A lateral SOI device as in claim 1, further comprising a field oxide layer over a major portion of said lateral drift region, said gate electrode extending over at least a portion of said field oxide.

* * * * *